US012628571B2

(12) United States Patent
Song et al.

(10) Patent No.: US 12,628,571 B2
(45) Date of Patent: May 12, 2026

(54) MAGNETORESISTIVE MEMORY DEVICE AND INTEGRATED MEMORY CIRCUIT

(71) Applicant: Taiwan Semiconductor Manufacturing Company, Ltd., Hsinchu (TW)

(72) Inventors: Ming-Yuan Song, Hsinchu City (TW); Chi-Feng Pai, New Taipei City (TW); Xinyu Bao, Fremont, CA (US); Chen-Yu Hu, New Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 399 days.

(21) Appl. No.: 18/484,462

(22) Filed: Oct. 11, 2023

(65) Prior Publication Data
US 2025/0127063 A1 Apr. 17, 2025

(51) Int. Cl.
| | |
|---|---|
| *H10N 50/80* | (2023.01) |
| *H10B 61/00* | (2023.01) |
| *H10N 50/20* | (2023.01) |
| *H10N 50/85* | (2023.01) |

(52) U.S. Cl.
CPC .............. *H10N 50/80* (2023.02); *H10B 61/22* (2023.02); *H10N 50/20* (2023.02); *H10N 50/85* (2023.02)

(58) Field of Classification Search
CPC ............................... H10N 50/20; H10N 50/10
See application file for complete search history.

(56) References Cited

U.S. PATENT DOCUMENTS

| | | | |
|---|---|---|---|
| 2025/0133968 A1* | 4/2025 | Tsou ...................... | G11C 11/161 |
| 2025/0176192 A1* | 5/2025 | Lille ...................... | H10N 50/10 |

* cited by examiner

*Primary Examiner* — Amar Movva
(74) *Attorney, Agent, or Firm* — JCIPRNET

(57) ABSTRACT

A magnetoresistive memory device and an integrated memory circuit are provided. The magnetoresistive memory device includes a magnetic tunneling junction (MTJ) and a composite spin orbit torque (SOT) channel in contact with a terminal of the MTJ. The SOT channel includes: a first channel layer, configured to convert a portion of a charge current into an orbital current based on orbital Hall effect; and a second channel layer, covering the first channel layer, and configured to convert a portion of the charge current into a first spin current based on spin Hall effect, and to convert the orbital current to a second spin current.

20 Claims, 11 Drawing Sheets

400

MAGNETORESISTIVE MEMORY DEVICE AND INTEGRATED MEMORY CIRCUIT

BACKGROUND

Magnetoresistive random access memory (MRAM) is one of the leading candidates for next-generation memory technologies that aim to surpass the performance of various existing memories. MRAM offers comparable performance to volatile static random access memory (SRAM) and comparable density with lower power consumption to volatile dynamic random access memory (DRAM). As compared to non-volatile flash memory, MRAM offers much faster access speed and suffers minimal degradation over time. Spin orbit torque MRAM (SOT-MRAM) is a type of MRAM. As compared to spin transfer torque MRAM (STT-MRAM), which is another type of MRAM, SOT-MRAM offers better performance in terms of speed and endurance. Nevertheless, further reducing switching energy of SOT-MRAM is limited.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
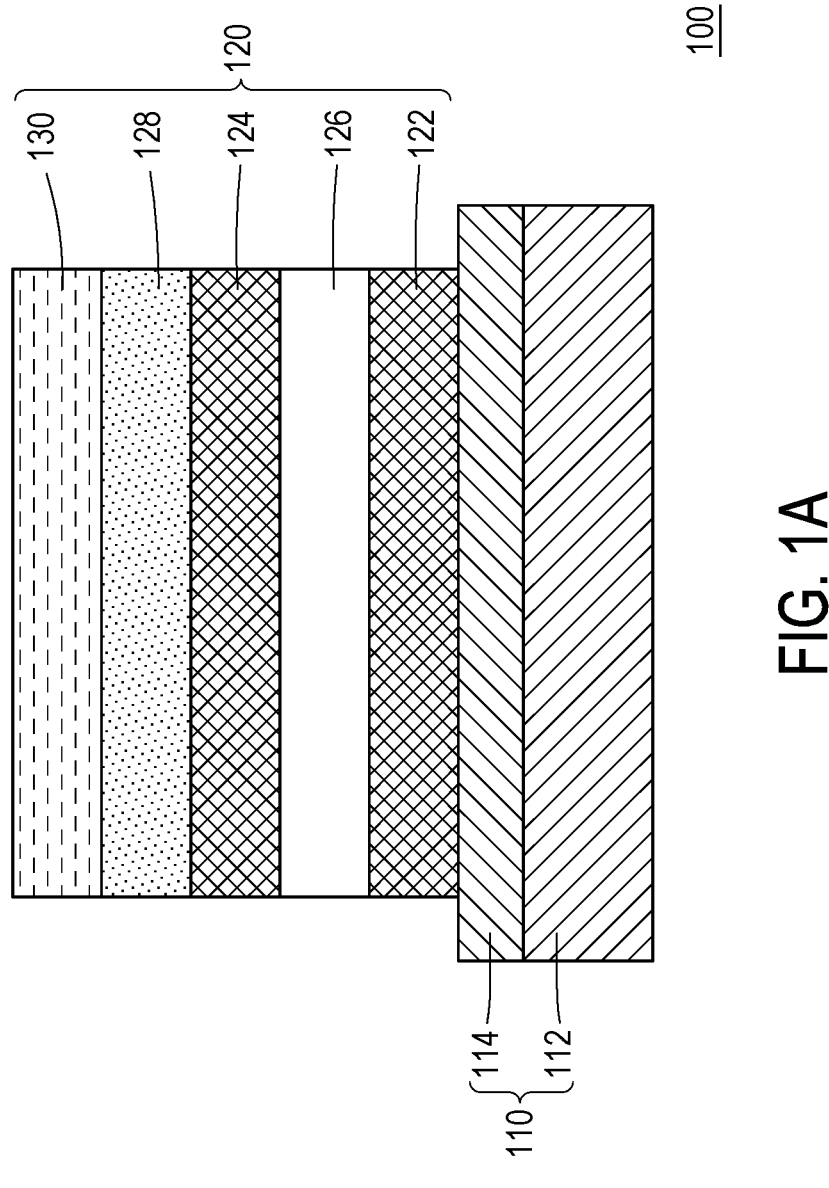
FIG. 1A is a schematic cross-sectional view illustrating a magnetoresistive memory device, according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic cross-sectional view illustrating a magnetoresistive memory device 100, according to some embodiments of the present disclosure.

Referring to FIG. 1A, the magnetoresistive memory device 100 includes a spin orbit torque (SOT) channel 110 and a magnetic tunneling junction (MTJ) 120 standing on top of the SOT channel 110. The MTJ 120 is functioned as a storage element, whereas the SOT channel 110 is configured to induce SOT in the MTJ 120, in order to program the MTJ 120.

Specifically, magnetization orientations of ferromagnetic layers in the MTJ 120 may determine an electrical resistance of the MTJ 120. The MTJ 120 may have a low electrical resistance state when the magnetization orientations are at a parallel state, and have a high electrical resistance state when the magnetization orientations are at an anti-parallel state. By altering the magnetization orientations in the MTJ 120, the MTJ 120 can be programmed to store complementary logic sates (e.g., a logic high state indicating the high electrical resistance state and a logic low state indicating the low electrical resistance state). During a programming operation, an in-plane charge current passing through the SOT channel 110 may be converted to a perpendicular spin current. The perpendicular spin current then flows into a ferromagnetic layer in the MTJ 120 and switch its magnetization via SOT. In this way, the magnetization orientations of the MTJ 120 (i.e., the electrical resistance of the MTJ 120) can be altered, and bit data can be programmed into the MTJ 120. During a read operation, the resistance state of the MTJ 102 can be sensed, and the bit data stored in the MTJ 120 can be read out.

The MTJ 120 may be a multilayer structure, and at least includes a free layer 122, a reference layer 124 and a barrier layer 126 sandwiched between the free layer 122 and the reference layer 124. In some embodiments, the free layer 122 and the reference layer 124 respectively include at least one ferromagnetic layer, while the barrier layer 126 includes at least one insulating layer. A magnetization direction of the reference layer 124 is pinned, and a magnetization direction of the free layer 122 can be altered by the SOT induced by the SOT channel 110. When the magnetization directions of the free layer 122 and the reference layer 124 are in the parallel state, the MTJ 120 is in the low electrical resistance state. On the other hand, when the magnetization directions of the free layer 122 and the reference layer 124 are in the anti-parallel state, the MTJ 120 is in the high electrical resistance state. In addition, the insulating barrier layer 126 provides isolation between the free layer 122 and the reference layer 124, while being thin enough to be tunneled through by the read current. In some embodiments, the free layer 122 is formed of a cobalt-iron-boron (CoFeB) alloy, a cobalt-palladium (CoPd) alloy, a cobalt-iron (CoFe) alloy, a cobalt-iron-boron-tungsten (CoFeBW) alloy, a nickel-iron (NiFe) alloy, a cobalt-iron-aluminum (CoFeAl) alloy, cobalt, iron, ruthenium, the like or combinations thereof. In some embodiments, the reference layer 124 is formed of the CoFeB alloy. Moreover, in some embodiments, the barrier layer 126 is formed of magnesium oxide, aluminum oxide, aluminum nitride, the like or combinations thereof. However, those skilled in the art may select other suitable materials for the free layer 122, the reference layer 124 and the barrier layer 126 according to design or process requirements, the present disclosure is not limited thereto.

In some embodiments, the MTJ 120 further includes a pinning layer 128. The pinning layer 128 may be disposed on the reference layer 124, and is configured to pin the magnetization direction in the reference layer 124 by exchange coupling with the reference layer 124. In some embodiments, the pinning layer 128 is formed of an anti-ferromagnetic material. For instance, the anti-ferromagnetic material may include IrMn, PtMn, or $Ni_xMn_{1-x}$ (0.1<x<0.5). Furthermore, in some embodiments, a synthetic antiferromagnets (SAF) structure (not shown) is further disposed on the reference layer 124. In these embodiments, the SAF structure may be located between the pinning layer 128 and the reference layer 124. The SAF structure may enhance the pinning of the magnetization direction in the reference layer 124, and may include anti-ferromagnetic layers separated by a nonmagnetic spacer layer. For instance, the anti-ferromagnetic layers may respectively include cobalt/platinum (Co/Pt) multilayers, cobalt/palladium (Co/Pd) multilayers or the like, while the spacer layer is such as a ruthenium layer. In alternative embodiments, the MTJ 120 includes the SAF structure for pinning the magnetization direction in the reference layer 124, while the pinning layer 128 is omitted.

Furthermore, in some embodiments, the MTJ 120 further includes a capping layer 130 as an outermost layer (e.g., a topmost layer) in the MTJ 120. In those embodiments where the reference layer 124 is covered by the pinning layer 128, the capping layer 130 may be disposed on the pinning layer 126. The capping layer 130 may protect the underlying layer(s) from etching damage and/or oxidation. According to some embodiments, the capping layer 130 is formed of a conductive material, such as tantalum, tantalum nitride, titanium, titanium nitride, the like or combinations thereof.

On the other hand, as being functioned to induce SOT in the free layer 122, the SOT channel 110 may include a first channel layer 112 and a second channel layer 114 stacked on top of the first channel layer 112. As will be described in greater details, the first channel layer 112 is configured to generate orbital current by orbital Hall effect, whereas the second channel layer 114 is configured to generate spin current by spin Hall effect, and to convert the orbital current to extra spin current. As compared to a single spin hall electrode that can only generate spin current by spin Hall effect, the composite SOT channel 110 according to embodiments of the present disclosure can create much more spin current, and therefore exert much greater torque on the free layer 122. As a result, the free layer 122 can be programmed with improved efficiency.

Figure 1B:
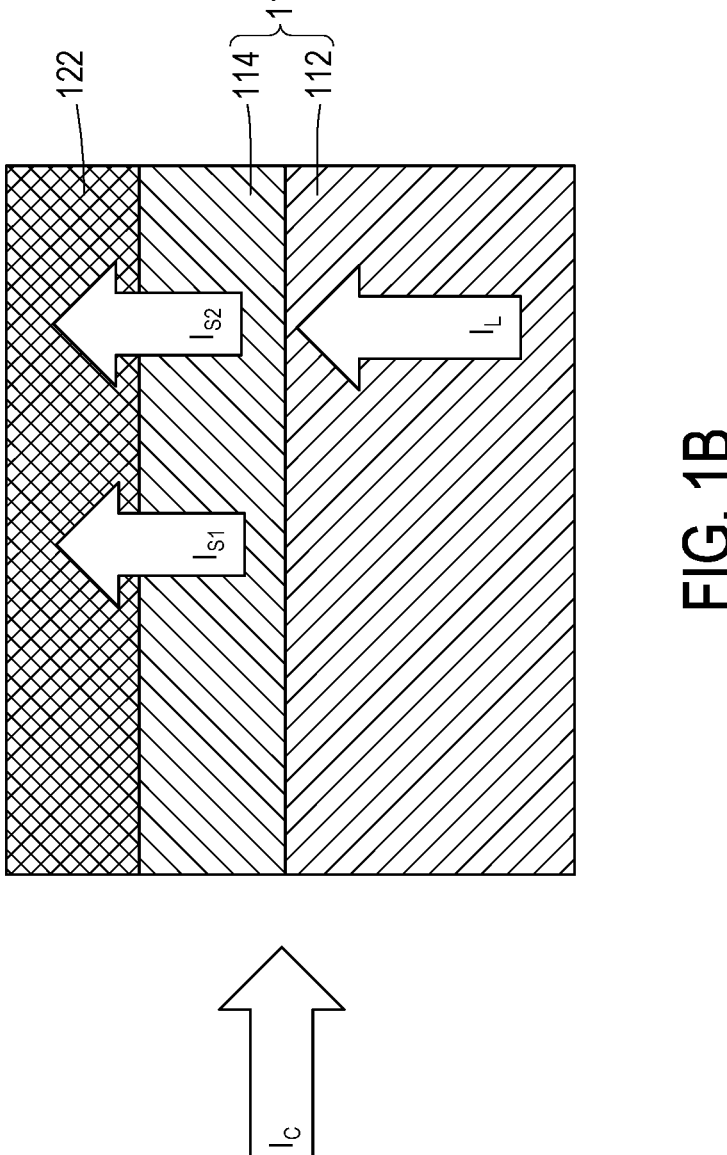
FIG. 1B is a schematic diagram illustrating a charge-to-spin conversion process implemented by the SOT channel in the magnetoresistive memory device shown in FIG. 1A.

FIG. 1B is a schematic diagram illustrating a charge-to-spin conversion process implemented by the SOT channel 110.

Referring to FIG. 1A and FIG. 1B, an in-plane charge current $I_C$ is provided to the SOT channel 110 during a programming operation. Based on orbital Hall effect, the first channel layer 112 converts the incoming charge current $I_C$ to a perpendicular orbital current $I_L$. Meanwhile, the second channel layer 114 not only converts the incoming charge current $I_C$ to a perpendicular spin current $I_{S1}$, but also converts the orbital current $I_L$ to an extra spin current $I_{S2}$. The orbital current $I_L$ may be opposite to the spin current $I_{S1}$ in terms of direction. Nevertheless, a direction of the spin current $I_{S2}$ converted from the orbital current $I_L$ may be aligned with the direction of the spin current $I_{S1}$. Therefore, instead of cancelling each other, the spin currents $I_{S1}$, $I_{S2}$ collectively exert spin-orbit torque on the free layer 122. In other words, as compared to a single spin hall electrode, the SOT channel 110 utilizing both of spin Hall effect and orbital Hall effect is able to induce greater torque on the free layer 122 by receiving the same charge current. That is, a more promising switching efficiency can be ensured by using the composite SOT channel 110.

The first channel layer 112 in the SOT channel 110 is formed of a material with great orbital Hall angle (defined as conversion efficiency from charge current to orbital current), so as to produce the orbital current $I_L$, with high efficiency. As an example, the first channel layer 112 may be formed of chromium. Alternatively, the first channel layer 112 may be formed of vanadium, manganese, titanium, or another conductive material with high orbital Hall angle. Experimental results show that the orbital Hall angle of the first channel layer 112 is in positive correlation with an electrical resistivity of the first channel layer 112. In order to ensure high orbital Hall angle of the first channel layer 112, the first channel layer 112 may be formed with high electrical resistivity. For instance, the first channel layer 112 may be formed with an electrical resistivity ranging from 100 μΩ·cm to 1400 μΩ·cm. According to some embodiments, a sputtering system (e.g., a magnetron sputtering system) is used for depositing the first channel layer 112. In these embodiments, direct current (DC) power for sputtering the first channel layer 112 may range from 20 W to 120 W, preferably range from 25 W to 50 W, to ensure high resistivity (i.e., high orbital Hall angle). Further, in some embodiments, a thickness of the first channel layer 112 ranges from 0.2 nm to 10 nm.

On the other hand, the second channel layer 114 of the SOT channel 110 is formed of a material with great spin Hall conductivity and great orbital-to-spin conversion efficiency. That is, such material may possess high spin Hall angle (defined as conversion efficiency from charge current to spin current) and low electrical resistivity, and is capable of converting the orbital current $I_L$ to the spin current $I_{S2}$ with high efficiency. As an example, the second channel layer 114 may be formed of tungsten. Alternatively, the second channel layer 114 may be formed of nickel, platinum, tantalum, gold or another conductive material with high spin Hall conductivity and orbital-to-spin conversion efficiency. In some embodiments, an electrical resistivity of the second channel layer 114 is lower than the electrical resistivity of the first channel layer 112. In these embodiments, the composite SOT channel 110 can have a rather low sheet resistance, to avoid a great part of the charge current $I_C$ from taking a low resistance path through the MTJ 120, rather than being converted to the spin current $I_{S1}$, $I_{S2}$. Further, in some embodiments, a thickness of the second channel layer 114 ranges from 0.5 nm to 5 nm, and total thickness of the SOT channel 110 ranges from 0.7 nm to 20 nm.

In the embodiments shown in FIG. 1A and FIG. 1B, the SOT channel 110 includes a single pair of the first channel layer 112 and the second channel layer 114. However, the present disclosure is not limited to how many pair(s) of the first and second channel layers 112, 114 are included.

Figure 2:
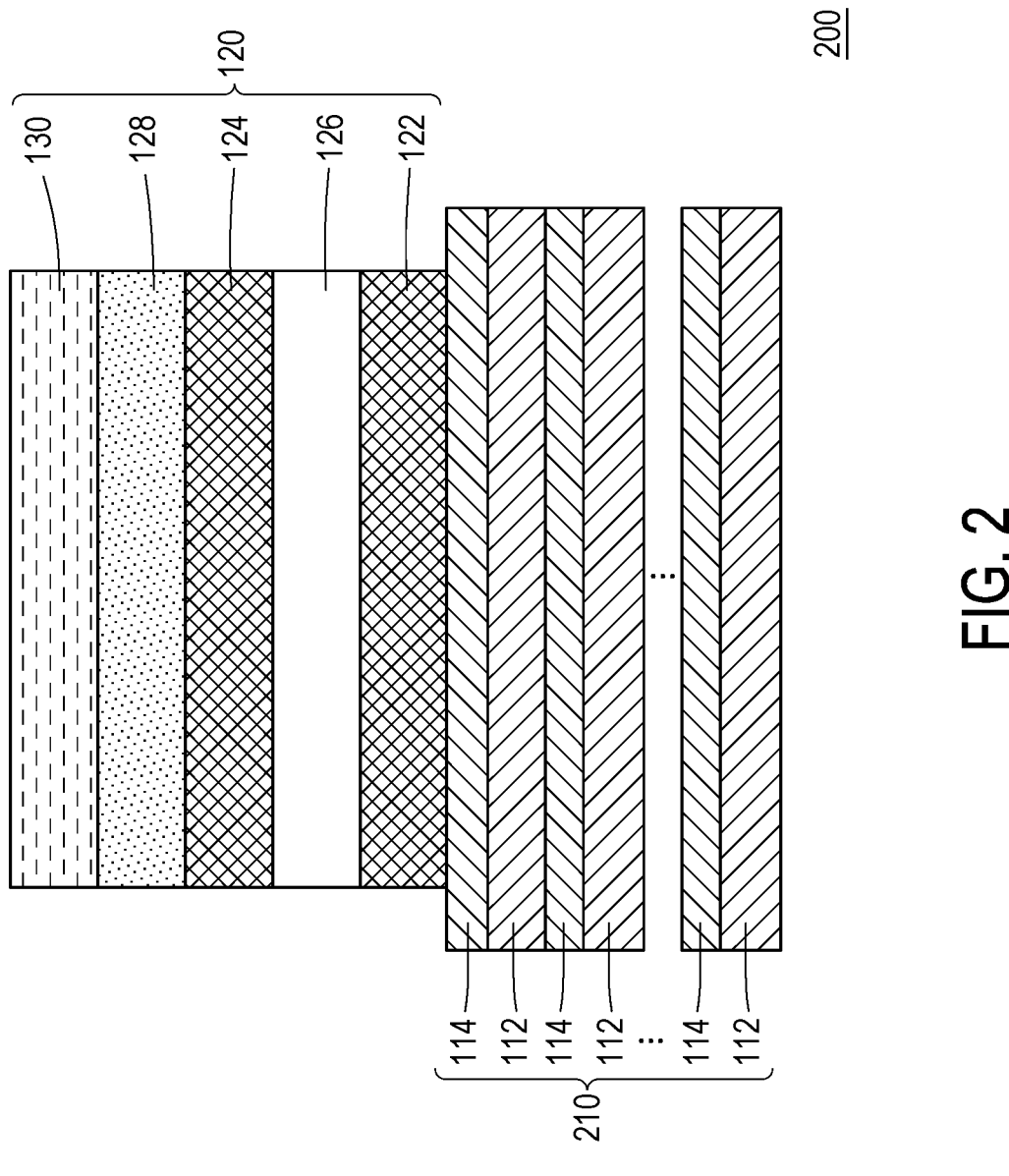
FIG. 2 is a schematic cross-sectional view illustrating a magnetoresistive memory device, according to some embodiments of the present disclosure.

FIG. 2 is a schematic cross-sectional view illustrating a magnetoresistive memory device 200, according to some embodiments of the present disclosure.

As similar to the magnetoresistive memory device 100 described with reference to FIG. 1A, the magnetoresistive memory device 200 includes the MJT 120 as a data storage device. As a difference from the magnetoresistive memory device 100, a SOT channel 210 in the magnetoresistive memory device 200 includes multiple pairs of the first and second channel layers 112, 114. As an example, two to eight pairs of the first and second channel layers 112, 114 may be stacked in the SOT channel 210. In the SOT channel 210, the first channel layers 112 and the second channel layers 114 are alternately stacked along a vertical direction, and each first channel layer 112 is covered by one of the second channel layers 114. As similar to the mechanism illustrated in FIG. 1B, the orbital currents generated by the first channel layers 112 can be converted to spin currents by the covered second channel layers 114. In this way, spin currents generated by the second channel layers 114 as well as the spin currents originated from the orbital currents generated by the first channel layers 112 all contribute to inducing SOT in the free layer 122. Therefore, magnetization of the free layer 122 can be switched by the SOT channel 210 with high efficiency as well.

In terms of thickness range, material selection, resistivity range and sputtering power, each first channel layer 112 and each second channel layer 114 in the SOT channel 210 may be identical with the first channel layer 112 and the second channel layer 114 in the SOT channel 110, respectively. As an alternative, the first channel layers 112 in the SOT channel 210 may be identical with one another in terms of material, and/or the second channel layers 114 in the SOT channel 210 may be identical with one another in terms of material. As another alternative, at least one of the first channel layers 112 may be different from others in terms of material, and/or at least one of the second channel layers 114 may be different from others in terms of material. Similarly, the first channel layers 112 may be formed with the same thickness, the same resistivity and/or the same sputtering power, or at least some of the first channel layers 112 are different from others in terms of thickness, resistivity and/or sputtering power. In some embodiments, a total thickness of the SOT channel 210 ranges from 0.7 nm to 20 nm.

The magnetoresistive memory devices 100, 200 and a magnetoresistive memory device with a SOT channel only having a single second channel layer 114 (referred to as single spin Hall electrode (SHE) magnetoresistive memory device) are tested, to observe improvements resulted from the combination of the first and second channel layers 112, 114. The tested magnetoresistive memory devices have identical MTJs 120. The tested magnetoresistive memory device 100 includes the SOT channel 110 having 4 nm (as in thickness) of chromium as the first channel layer 112 and 1 nm (as in thickness) of tungsten as the second channel layer 114. The tested magnetoresistive memory device 200 includes three pairs of the first and second channel layers 112, 114, in which each first channel layer 112 is formed of 0.4 nm (as in thickness) chromium and each second channel layer 114 is formed of 1 nm (as in thickness) tungsten. In addition, the tested single SHE magnetoresistive memory device includes 4 nm (as in thickness) of tungsten as the SOT channel.

Figure 3:
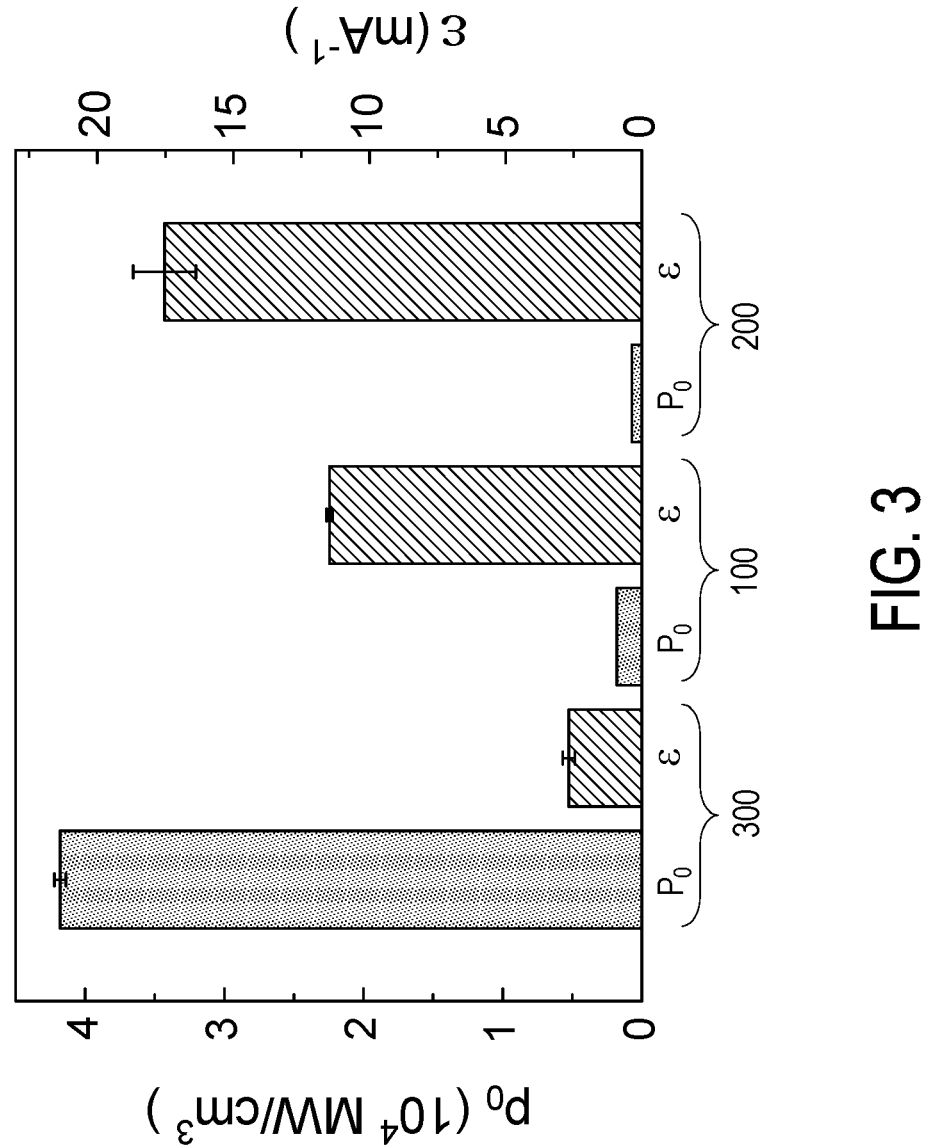
FIG. 3 is a bar graph showing respective power density and respective switching efficiency of the magnetoresistive memory devices shown in FIG. 1A and FIG. 2 as well as a single spin Hall electrode (SHE) magnetoresistive memory device.

FIG. 3 is a bar graph showing respective power density $P_0$ and respective switching efficiency $\varepsilon$ of the tested magnetoresistive memory devices 100, 200 and the tested single SHE magnetoresistive memory device 300.

The power density $P_0$ indicates power consumption for switching a data bit, and is defined as a product of electrical resistivity (of SOT channel) and square of zero-thermal critical switching current density. As shown in FIG. 3, the power density $P_0$ of each of the tested magnetoresistive memory devices 100, 200 is significantly lower than the power density $P_0$ of the tested single SHE magnetoresistive memory device 300. The SOT channels 110, 210 in the tested magnetoresistive memory devices 100, 200 respectively include pair(s) of the first channel layer 112 (high electrical resistivity) and the second channel layer 114 (low electrical resistivity), thus may have a slightly higher electrical resistivity than the SOT channel in the tested single SHE magnetoresistive memory device 300, which only includes the second channel layer 114 (low electrical resistivity). Even though, owing to the contribution of orbital Hall effect and orbit-to-spin conversion, the zero-thermal critical switching current density required for switching a data bit in each of the tested magnetoresistive memory devices 100, 200 is much lower than the zero-thermal critical switching current density required for switching a data bit in the tested single SHE magnetoresistive memory device 300. As a result, as compared to the tested single SHE magnetoresistive memory device 300, each of the tested magnetoresistive memory devices 100, 200 requires much lower power density $P_0$ for switching a data bit.

On the other hand, the switching efficiency $\varepsilon$ is defined as a ratio of thermal stability over zero-thermal critical switching current. The thermal stability indicates how well a stored data bit can prevent from being accidentally altered, and the zero-thermal critical switching current indicates a current required for programming a data bit under zero-thermal condition. Test results show that the tested magnetoresistive memory devices 100, 200 may have slightly lower thermal stability, as compared to the tested single SHE magnetoresistive memory device 300. Nevertheless, the tested magnetoresistive memory devices 100, 200 respectively require a much lower zero-thermal critical switching current for switching a data bit under zero-thermal condition, as compared to the tested single SHE magnetoresistive memory device 300. As a result shown in FIG. 3, the switching efficiency $\varepsilon$ of each of the tested magnetoresistive memory devices 100, 200 is significantly higher than the switching efficiency $\varepsilon$ of the tested single SHE magnetoresistive memory device 300.

As described, despite having slightly higher electrical resistivity and slightly lower thermal stability, each of the tested magnetoresistive memory devices 100, 200 has much improved power density $P_0$ and switching efficiency $\varepsilon$ over the tested single SHE magnetoresistive memory device 300, as a result of the orbital Hall effect and orbit-to-spin conversion. Equivalently, the SOT channels 110, 210 in the tested magnetoresistive memory devices 100, 200 respectively have a spin Hall angle greater (in absolute value) than a spin Hall angle of the SOT channel in the tested single SHE magnetoresistive memory device 300. Calculation result shows that the SOT channel 110 in the tested magnetoresistive memory device 100 has an equivalent spin Hall angle of −0.30, and the SOT channel 210 in the tested magnetoresistive memory device 200 has an equivalent spin Hall angle of −0.32. In contrast, the SOT channel in the tested magnetoresistive memory device 300 has a smaller spin Hall angle of −0.23.

The magnetoresistive memory devices 100, 200 can be applied to a variety of memory integrated circuits. In each of these memory integrated circuits, memory cells respectively include the magnetoresistive memory device 100/200 and at least two access selectors for controlling access of the magnetoresistive memory device 100/200.

Figure 4A:
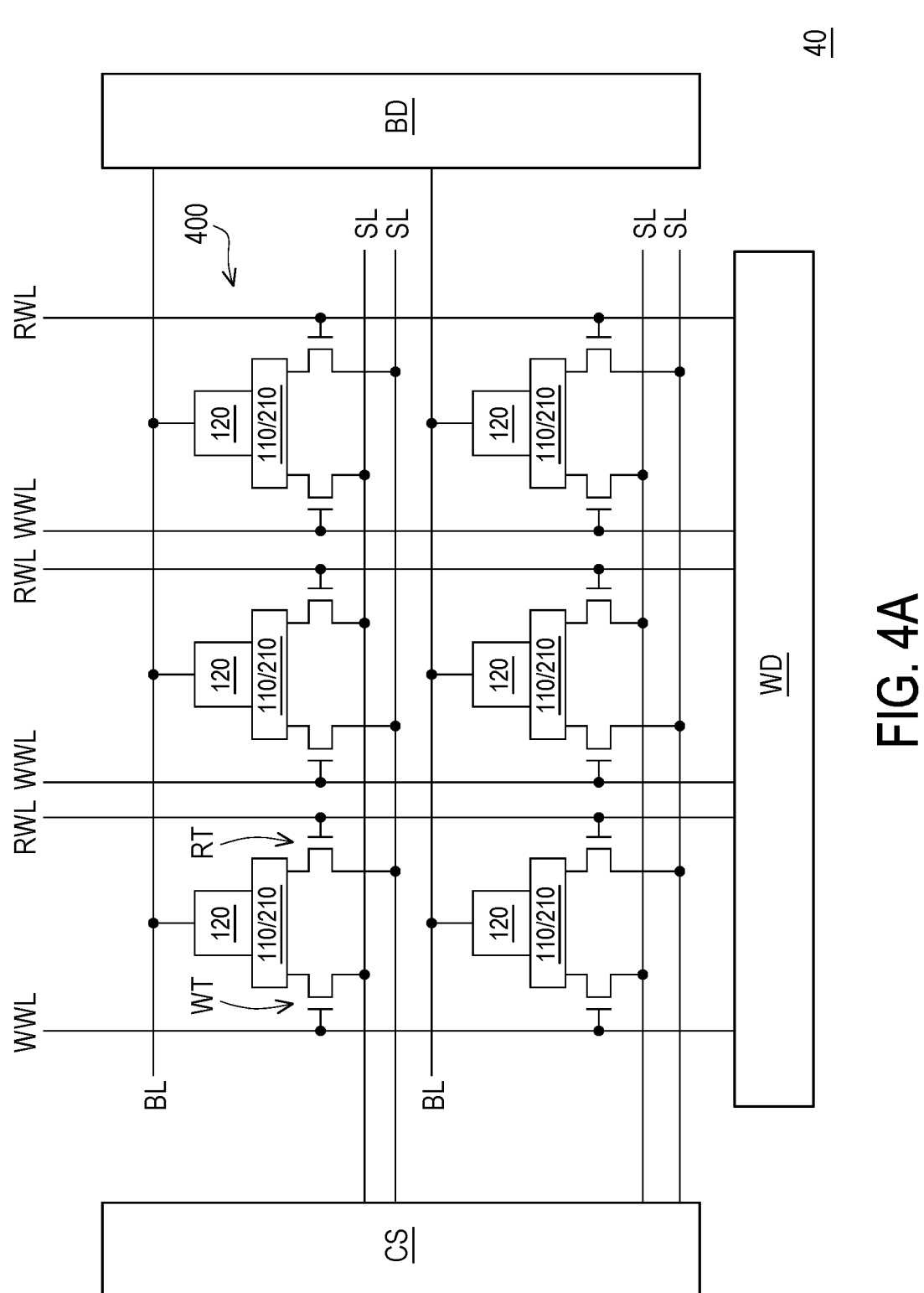
FIG. 4A is a circuit diagram schematically illustrating a memory integrated circuit, according to some embodiments of the present disclosure.

FIG. 4A is a circuit diagram schematically illustrating a memory integrated circuit 40 according to some embodiments of the present disclosure.

Referring to FIG. 4A, the memory integrated circuit 40 includes rows and columns of memory cells 400. The memory cells 400 respectively include the magnetoresistive memory device 100 or the magnetoresistive memory device 200. Further, each memory cell 400 includes a write transistor WT and a read transistor RT as access selectors of the magnetoresistive memory device 100/200. Specifically, the write transistor WT and the read transistor RT may be coupled to portions of the SOT channel 110/210 at opposite sides of the MTJ 120, such that the MTJ 120 can stand on a write current path (i.e., the in-plane charge current described above) between the write transistor WT and the read transistor RT. In this way, the write current path can be controlled by the write transistor WT and the read transistor RT. In addition, while a terminal of the MTJ 120 is in contact with the SOT channel 110/210, the other terminal of the MTJ 120 is coupled to a bit line BL. The read transistor RT may not be only operated for controlling the write current path, but also operated for controlling a read current path passing through the MTJ 120, to the bit line BL.

More specifically, the write transistor WT and the read transistor RT are respectively coupled to the SOT channel 110/210 by a source/drain terminal, whereas other source/drain terminals of the write transistor WT and the read transistor RT are coupled to a pair of source lines SL. In addition, a gate terminal of the write transistor WT is coupled to a write word line WWL, and a gate terminal of the read transistor RT is coupled to a read word line RWL. The memory cells 400 arranged along the same column may share the same write word line WWL as well as the same read word line RWL. On the other hand, the memory cells 400 arrange along the same row may share the same bit line BL and the same pair of the source lines SL.

In some embodiments, a word line driver circuit WD may be coupled to the write word lines WWL and the read word lines RWL, and configured to control switching of the write transistors WT and the read transistors RT through the write word lines WWL and the read word lines RWL. In addition, a current source circuit CS may be coupled to the source lines SL. The current source circuit CS is configured to provide the write current (i.e., the in-plane charge current described above) for programming the MTJs 120 as well as a read current for sensing the resistance states of the MTJs 120, and may be in conjunction with the word line driver circuit WD. Further, a bit line driver circuit BD may be coupled to the bit lines BL, and configured to sense the read current passing through the MTJs 120, so as to identify the resistance states of the MTJs 120.

Figure 4C:
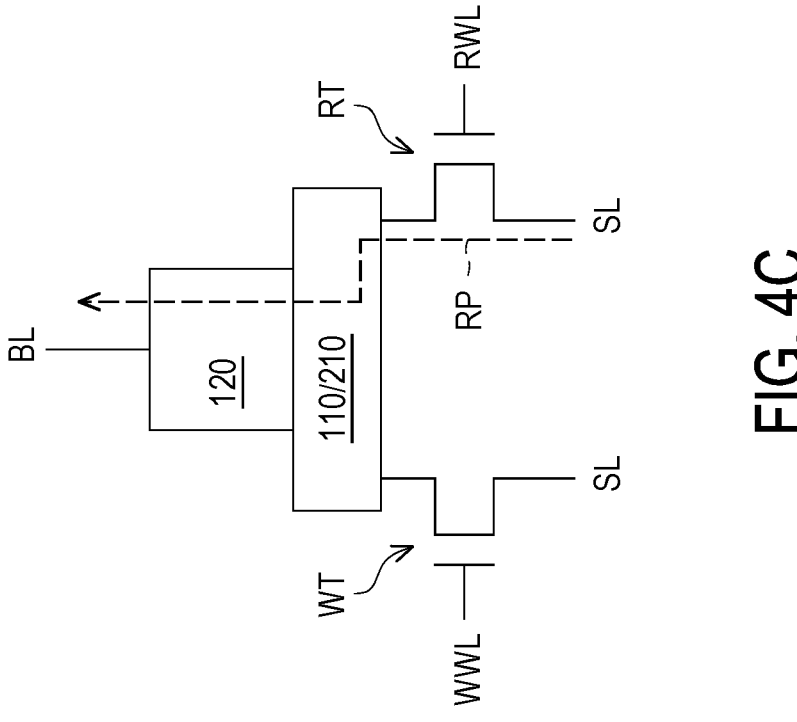
FIG. 4C illustrates a read path in a selected memory cell in the memory integrated circuit as shown in FIG. 4A.
Figure 4B:
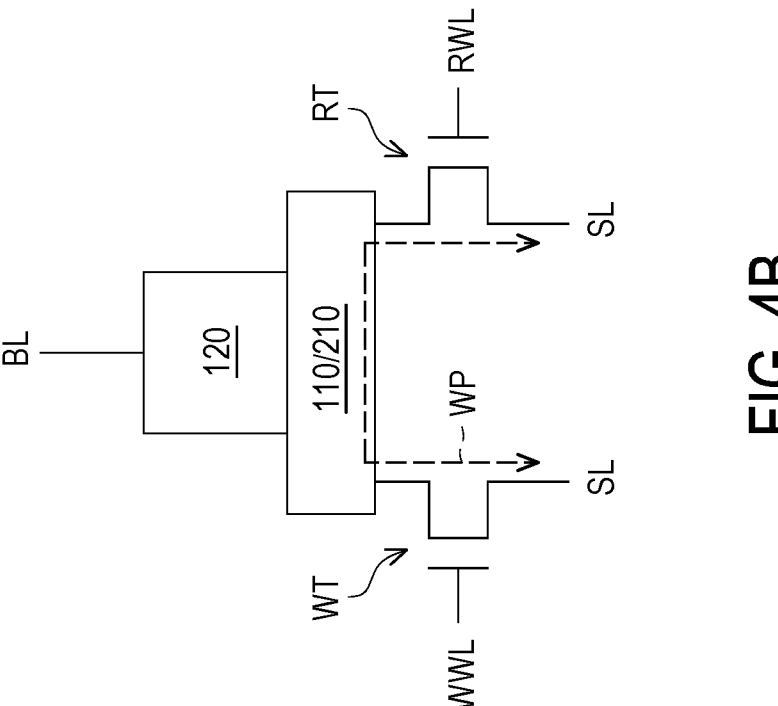
FIG. 4B illustrates a write path in a selected memory cell in the memory integrated circuit as shown in FIG. 4A.

FIG. 4B illustrates a write path in a selected memory cell 400 in the memory integrated circuit 40 as shown in FIG.

4A. FIG. 4C illustrates a read path in a selected memory cell 400 in the memory integrated circuit 40 as shown in FIG. 4A.

Referring to FIG. 4A and FIG. 4B, during a programming operation, the write transistor WT and the read transistor RT are both turned on by asserting the write word line WWL and the read word line RWL. In addition, a write voltage is provided to one of the source lines SL, whereas the other one of the source lines SL may be coupled to a reference voltage (e.g., a ground voltage). In this way, a write current WP (i.e., the in-plane charge current as described above) may flow through the write transistor WT, the read transistor RT and the SOT channel 110/210 in between. As described, the write current WP can be converted to perpendicular spin currents by the SOT channel 110/210 as a result of spin Hall effect and a combination of orbital Hall effect and orbit-to-spin conversion. The spin currents provided to the MTJ 120 may induce SOT in MTJ 120, thus the MTJ 102 can be subjected to programming. Meanwhile, the bit line BL may be floated, to avoid from establishing a vertical current path through the MTJ 120.

Referring to FIG. 4A and FIG. 4C, during a read operation, the read transistor RT is turned on by asserting the read word line RWL. In addition, a read voltage is provided to the bit line BL, while the source line SL coupled to the read transistor RT receives a reference voltage (e.g., a ground voltage). In this way, a read current RP passing through the read transistor RT, the SOT channel 110/120 and the MTJ 120 is established. Due to a spin orbit coupling effect, different magnetization orientations of the MTJ 120 (i.e., the parallel state and the anti-parallel state) may result a change in an amount of scattering of conduction electrons traveling across the MTJ 120. Such change leads to different electrical resistances of the MTJ 120, and may affect a magnitude of the read current RP or a magnitude of a voltage drop across the MTJ 120. Therefore, the bit data (i.e., the resistance state) stored in the MTJ 120 can be read out. In the meantime, the write word line WWL may not be asserted, and the source line SL coupled to the write transistor WT may be floated. Therefore, an in-plane charge current passing through the write transistor WT can be prevented.

Figure 4D:
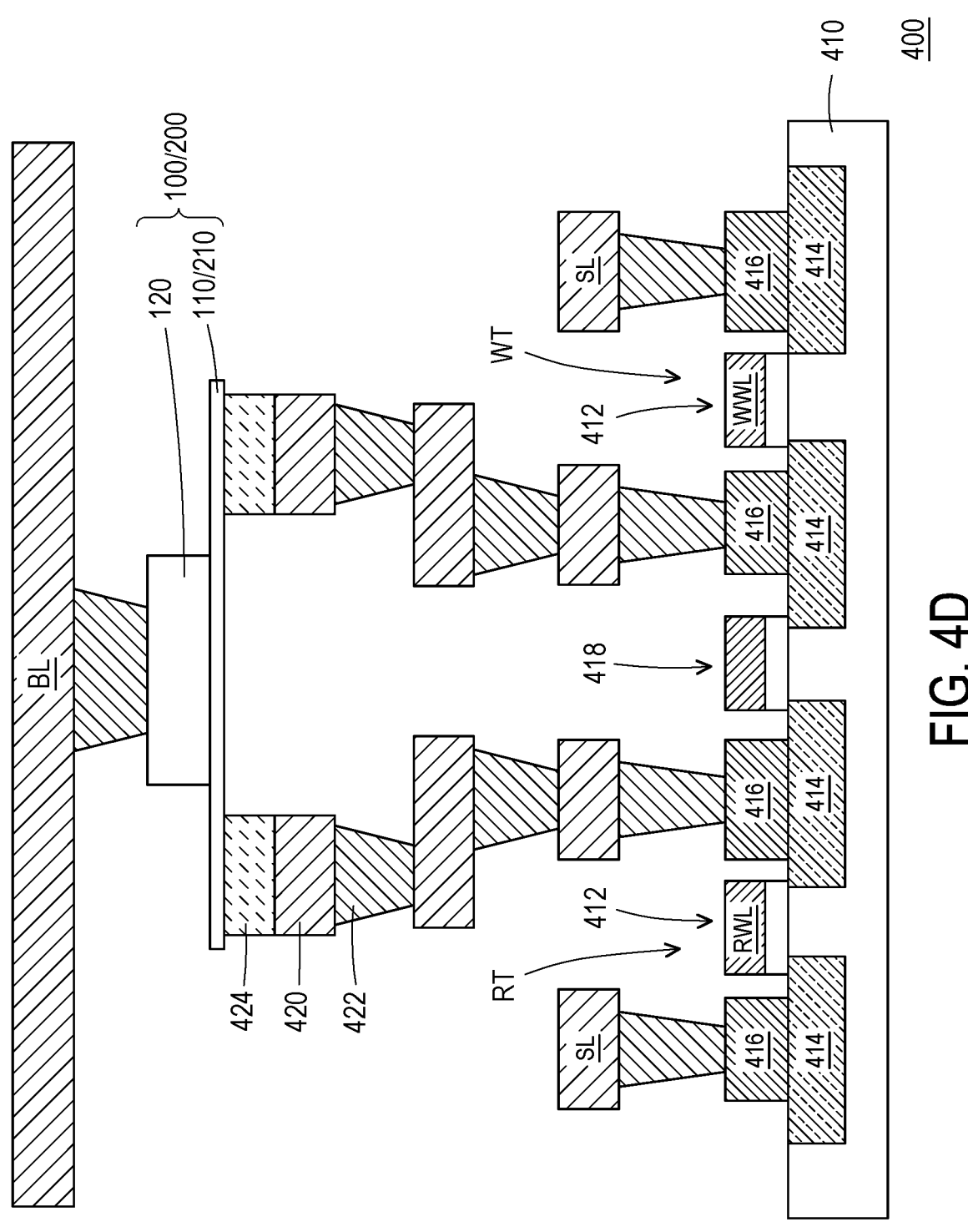
FIG. 4D is a schematic cross-sectional view illustrating one of the memory cells shown in FIG. 4A.

FIG. 4D is a schematic cross-sectional view illustrating one of the memory cells 400 shown in FIG. 4A.

Referring to FIG. 4D, the write transistor WT and the read transistor RT in each memory cell 400 may be formed at a front surface of a semiconductor substrate 410, and respectively implemented by a metal-oxide-semiconductor field effect transistor (MOSFET). Specifically, each of the write transistor WT and the read transistor RT may include a gate structure 412 disposed on the semiconductor substrate 410 and a pair of source/drain structures 414 at opposite sides of the gate structure 412 and in lateral contact with a portion of the semiconductor substrate 410 lying under the gate structure 412. In some embodiments, a gate electrode in the gate structure 412 of the write transistor WT further extends to be functioned as the write word line WWL, and a gate electrode in the gate structure 412 of the read transistor RT further extends to be functioned as the read word line RWL. Further, source/drain contacts 416 may be disposed on the source/drain structures 414 of the write transistor WT and the read transistor RT.

Although the write transistor WT and the read transistor RT are depicted as planar type or fin type MOSFETs, the write transistor WT and the read transistor RT may alternatively be formed as gate-all-around (GAA) type MOSFETs. Further, according to some embodiments, the write transistor WT are laterally spaced apart from each other, and a dummy gate structure 418 may be placed in between. In these embodiments, the dummy gate structure 418 is disposed on the semiconductor substrate 410, and located between one of the source/drain structures 414 of the read transistor RT and one of the source/drain structures 414 of the write transistor WT. In this way, a dummy transistor may be defined by the dummy gate structure 418 and the source/drain structures 414 at opposite sides of the dummy gate structure 418. By keeping the dummy transistor in an off state, unintentional crosstalk between the write transistor WT and the read transistor RT can be effectively blocked.

The magnetoresistive memory device 100/200 is embedded in a stack of metallization layers formed over the front surface of the semiconductor substrate 410. Conductive patterns 420 and conductive vias 422 are distributed around the magnetoresistive memory device 100/200 in the stack of metallization layers. The conductive patterns 420 provide lateral conduction paths, and the conductive vias 422 provide vertical conduction paths. Some of the conductive patterns 420 and the conductive vias 422 spread in between the magnetoresistive memory device 100/200 and the underlying write and read transistors WT, RT connect one of the source/drain contacts 416 of the write transistor WT and one of the source/drain contacts 416 of the read transistors RT to bottom electrode vias 424 in contact with the SOT channel 110/210 from below. In this way, connection between the access selectors (i.e., the write and read transistors WT, RT) and the magnetoresistive memory device 100/200 is established. On the other hand, the conductive pattern 420 connected to the other source/drain contact 416 and the conductive pattern 420 connected to the other source/drain contact 416 may be respectively provided as a source line SL. Further, one of the conductive patterns 420 lying over the MTJ 120 may be formed as the bit line BL, and may be connected to the MTJ 120 through an underlying conductive via 422.

According to the described embodiments, the write and read transistors WT, RT in each memory cell 400 are both connected to the SOT channel 110/210, while the MTJ 120 is connected to the bit line BL without any access selector in between. However, it should be appreciated that the magnetoresistive memory device 100/200 is not limited to the described architecture.

Figure 5A:
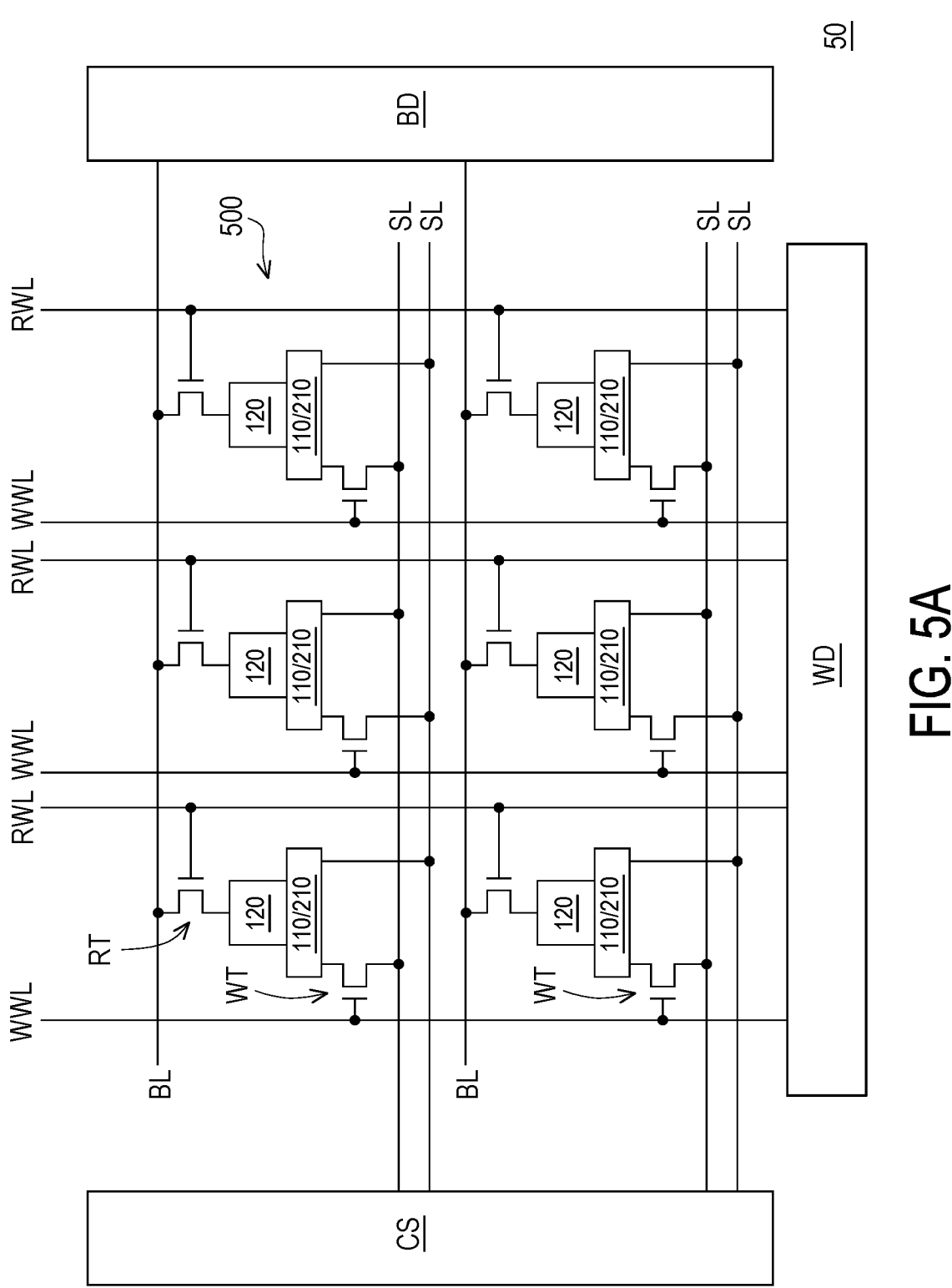
FIG. 5A is a circuit diagram schematically illustrating a memory integrated circuit, according to some embodiments of the present disclosure.

FIG. 5A is a circuit diagram schematically illustrating a memory integrated circuit 50 according to some embodiments of the present disclosure.

As an alternative, the magnetoresistive memory device 100/200 may be included in each memory cell 500 of the memory integrated circuit 50. As identical to the memory cell 400 described with reference to FIG. 4A, the memory cell 500 includes a write transistor WT and a read transistor RT as access selectors of the magnetoresistive memory device 100/200. The write transistor WT switchably connect the SOT channel 110/210 of the magnetoresistive memory device 100/200 to one of the source lines SL, and switching of the write transistor WT is controlled by the write word line WWL. As a difference from the memory cell 400 shown in FIG. 4A, the read transistor RT in the memory cell 500 does not couple to the SOT channel 110/210, but switchably connect the MTJ 120 to the bit line BL. Specifically, a source/drain terminal of the read transistor RT is connected to a terminal of the MTJ 120; the other source/drain terminal of the read transistor RT is connected to the bit line BL; and a gate terminal of the read transistor RT is connected to the read word line RWL for controlling switching of the read transistor RT. According to such configuration, the read transistor RT controls formation of the read current path passing through the MTJ 120, but do not participate in controlling formation of the write current path laterally passing through the SOT channel 110/210. While an edge region of the SOT channel 110/210 is switchably connected to one of the source lines SL, another edge region of the SOT channel 110/210 may be directly connected to the other source line SL. In this way, formation of the write current path is only controlled by the write transistor WT.

Specifically, during a programming operation, the write transistor WT is turned on by asserting the write word line WWL. In addition, a write voltage is provided to one of the source lines SL, whereas the other one of the source lines SL may be coupled to a reference voltage (e.g., a ground voltage). In this way, a write current may flow from one of the source lines SL to the other, and pass through the write transistor WT and the SOT channel 110/210 in between the source lines SL. As described, the write current can be converted to spin currents by the SOT channel 110/210 as a result of spin Hall effect and a combination of orbital Hall effect and orbit-to-spin conversion. The spin currents provided to the MTJ 120 may induce SOT in MTJ 120, thus the MTJ 120 can be subjected to programming. Meanwhile, the bit line BL may be floated, such that the read transistor RT is kept in an off state, to avoid from establishing a vertical current path through the MTJ 120.

On the other hand, during a read operation, the read transistor RT is turned on by asserting the read word line RWL. In addition, a read voltage is provided to the bit line BL, while the source line SL directly connected to the SOT channel 110/210 is coupled to a reference voltage (e.g., a ground voltage). In this way, a read current from the bit line BL to such source line SL and passing through the read transistor RT, the MTJ 120 and the SOT channel 110/120 is established. Due to a spin orbit coupling effect, different magnetization orientations of the MTJ 120 (i.e., the parallel state and the anti-parallel state) may result a change in an amount of scattering of conduction electrons traveling across the MTJ 120. Such change leads to difference electrical resistances of the MTJ 120, and may affect a magnitude of the read current or a magnitude of a voltage drop across the MTJ 120. Therefore, the bit data (i.e., the resistance state) stored in the MTJ 120 can be read out. In the meantime, the write word line WWL may not be asserted, and the source line SL coupled to the write transistor WT may be floated. Therefore, current laterally passing through the SOT channel 110/210 and accidentally programming the MTJ 120 can be blocked.

Figure 5B:
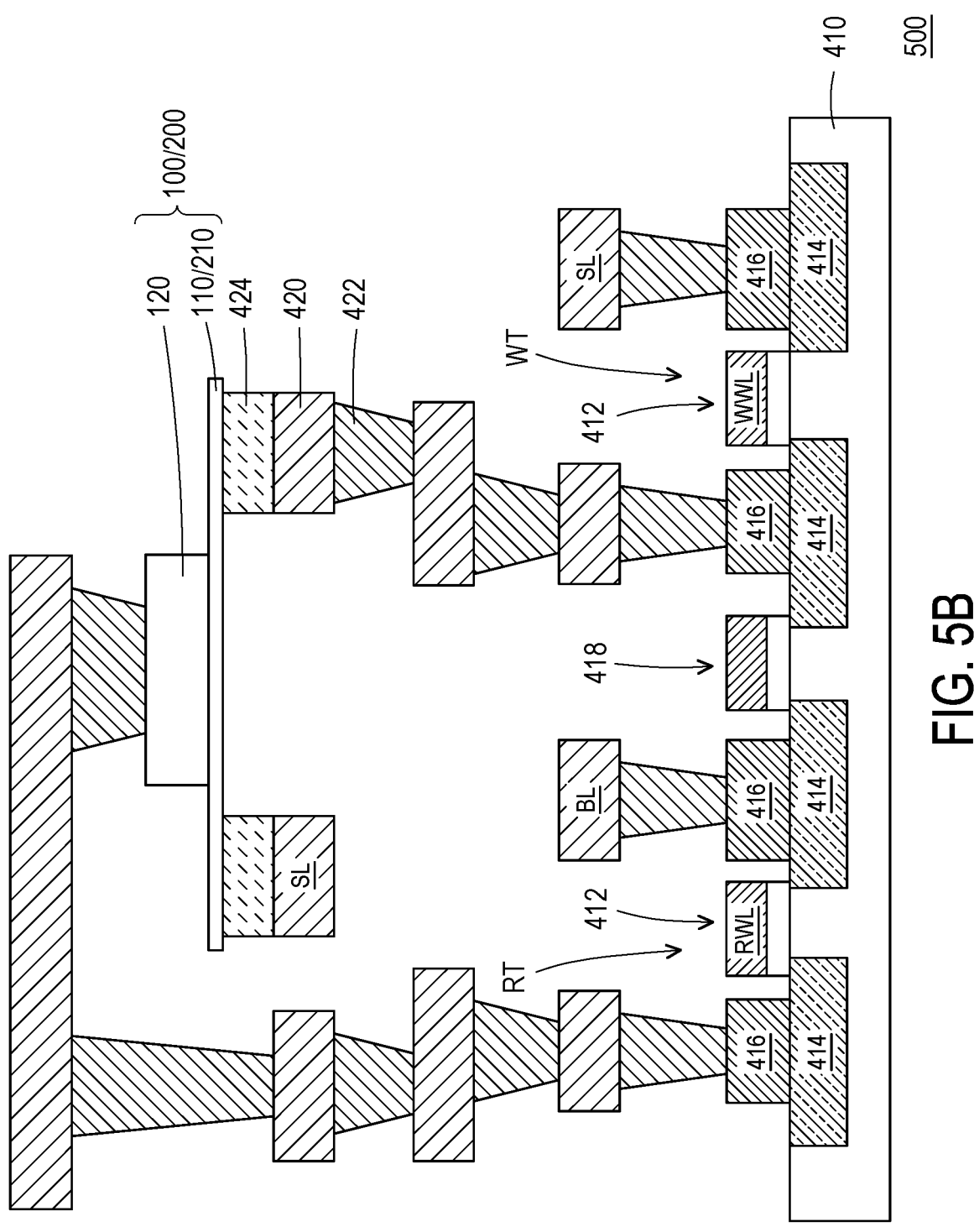
FIG. 5B is a schematic cross-sectional view illustrating one of the memory cells shown in FIG. 5A.

FIG. 5B is a schematic cross-sectional view illustrating one of the memory cells 500 shown in FIG. 5A.

A structure of each memory cell 500 is similar to the structure of each memory cell 400 as described with reference to FIG. 4D, except for a few differences. Specifically, as shown in FIG. 5B, the source/drain contacts 416 of the read transistor RT are not connected to the SOT channel 110/210. Instead, one of the source/drain contacts 416 of the read transistor RT is connected to one of the conductive patterns 420 vertically spaced apart from the bottom electrode vias 424 and functioned as the bit line BL, whereas the other source/drain contact 416 of the read transistor RT is connected to a top end of the MTJ 120 through a series of the conductive patterns 420 and the conductive vias 422. Further, while one of the bottom electrode vias 424 is connected to one of the source/drain contacts 416 of the write transistor WT, the other bottom electrode via 424 is connected to one of the conductive patterns 420 functioned as one of the source lines SL. On the other hand, how the write transistor WT is connected to the SOT channel 110/

210 and the other source line SL may be identical or similar to a scheme described with reference to FIG. 4D, and would not be repeated again.

The access selectors in the afore-described embodiments are implemented by transistors each having three terminals and directly formed on the front surface of the semiconductor substrate 410. In further embodiments, the access selectors are implemented by two-terminal selectors that are formed over the front surface of the semiconductor substrate 410.

Figure 6A:
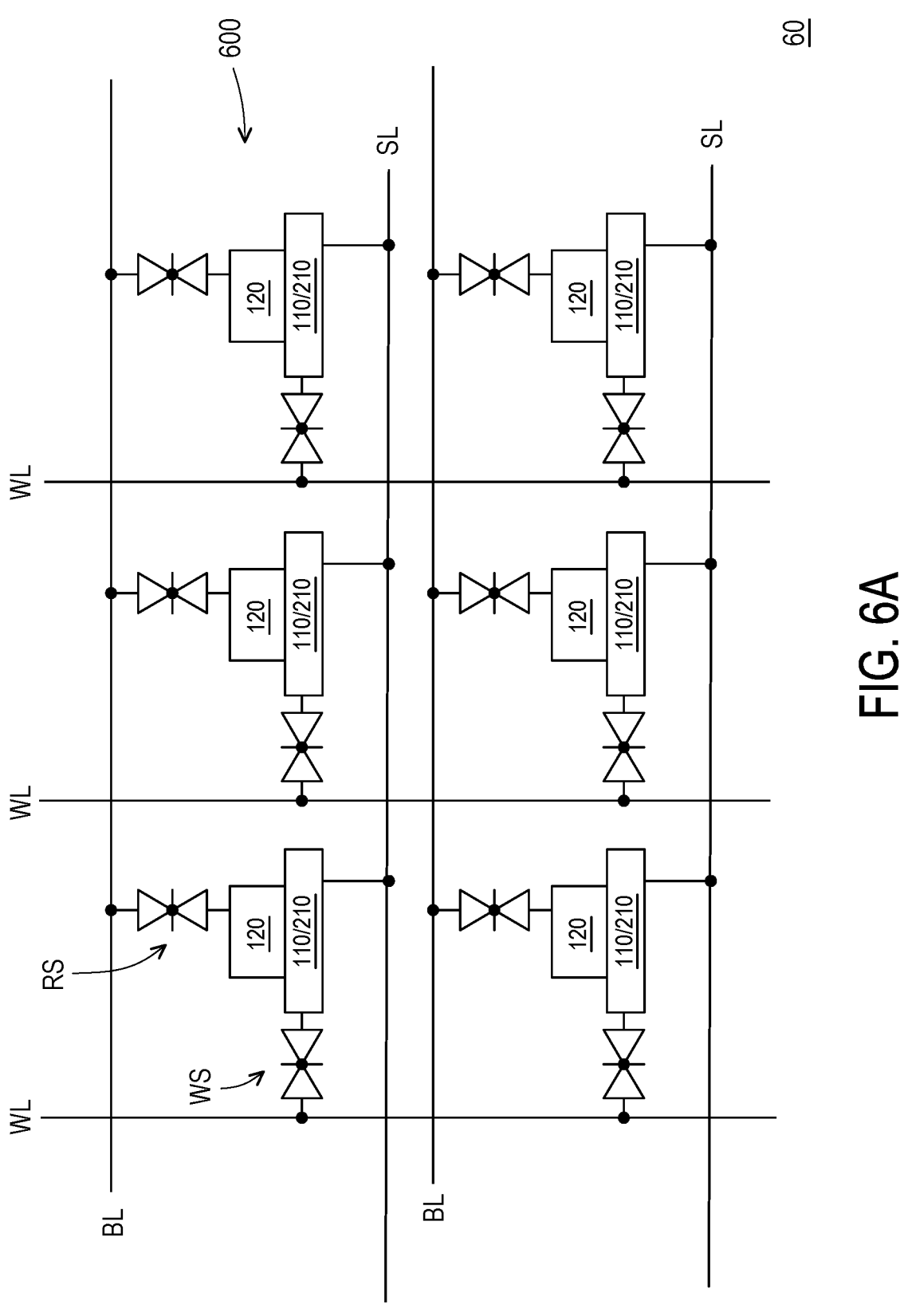
FIG. 6A is a circuit diagram schematically illustrating a memory integrated circuit, according to some embodiments of the present disclosure.

FIG. 6A is a circuit diagram schematically illustrating a memory integrated circuit 60 according to some embodiments of the present disclosure.

As a further alternative, the magnetoresistive memory device 100/200 may be included in each memory cell 600 of the memory integrated circuit 60. Each memory cell 600 includes a write selector WS and a read selector RS as access selectors of the magnetoresistive memory device 100/200. The write selector WS and the read selector RS are respectively a two-terminal selector. When a bias voltage across the two-terminal selector exceeds a threshold voltage, the two-terminal selector is turned on (i.e., switched to a low resistance state). Otherwise, the two-terminal selector is turned off (i.e., in a high resistance state). In some embodiments, the write selector WS and the read selector RS are respectively an exponential type selector or a threshold type selector. An exponential I-V curve may be observed on the exponential type selector, while a "snapback" I-V curve may be observed on the threshold type selector. As examples, the exponential type selector may be a metal-insulator-metal (MIM) based selector, and the threshold type selector may be a threshold switching selector (e.g., an ovonic threshold switching (OTS) selector, a metal-insulator-transition (MIT) selector, a field assist superlinear threshold (FAST) selector, a mixed ionic-electron conduction (MIEC) selector or the like.

A terminal of the write selector WS is coupled to the SOT channel 110/210, whereas the other terminal of the write selector WS is coupled to a word line WL. While an edge region of the SOT channel 110/210 is switchably coupled to the word line WL through the write selector WS, another edge region of the SOT channel 110/210 may be directly coupled to a source line SL. In addition, a terminal of the read selector RS is coupled to the MTJ 120, whereas the other terminal of the read selector RS is coupled to a bit line BL. According to some embodiments, the memory cells 600 in the same column may share the same word line WL, and the memory cells 600 in the same row may share the same bit line BL and the same source line SL. Further, although not shown, the word lines WL, the bit lines BL and the source lines SL may be connected to respective drivers.

During a programming operation, a write voltage may be provided to one of the word line WL and the source line SL connected to a selected one of the memory cells 600, and a reference voltage (e.g., a ground voltage) may be provided to the other one of the word line WL and the source line SL connected to the selected memory cell 600. As a result, the write selector WS in the selected memory cell 600 is turned on by a voltage bias set across the write selector WS, and a write current is established across the SOT channel 110/210 of the magnetoresistive memory device 100/200 in the selected memory cell 600. As described, the write current can be converted to spin currents by the SOT channel 110/210 as a result of spin Hall effect and a combination of orbital Hall effect and orbit-to-spin conversion. The spin currents provided to the MTJ 120 may induce SOT in MTJ 120, thus the MTJ 120 can be subjected to programming.

Meanwhile, the bit line BL may be floated, such that the read selector RS is kept in an off state. In this way, a current path passing through the MTJ 120 can be blocked.

During a read operation, a read voltage may be provided to the bit line BL connected to a selected one of the memory cells 600, and a reference voltage (e.g., a ground voltage) may be provided to the source line SL connected to the selected memory cell 600. As a result, the read selector RS in the selected memory cell 600 is turned on by a voltage bias set across the read selector RS, and a read current flowing along a vertical direction through the MTJ 120 and the SOT channel 110/210 of the magnetoresistive memory device 100/200 in the selected memory cell 600 is established. As described, by sensing the read current, the bit data stored in the MTJ 120 can be read out. In the meantime, the word line WL may be floated, such that the write selector WS is kept in an off state. Therefore, a write current may not be established across the SOT channel 110/210 during reading, thus the MTJ 120 can be avoided from being accidentally programmed during reading.

Figure 6B:
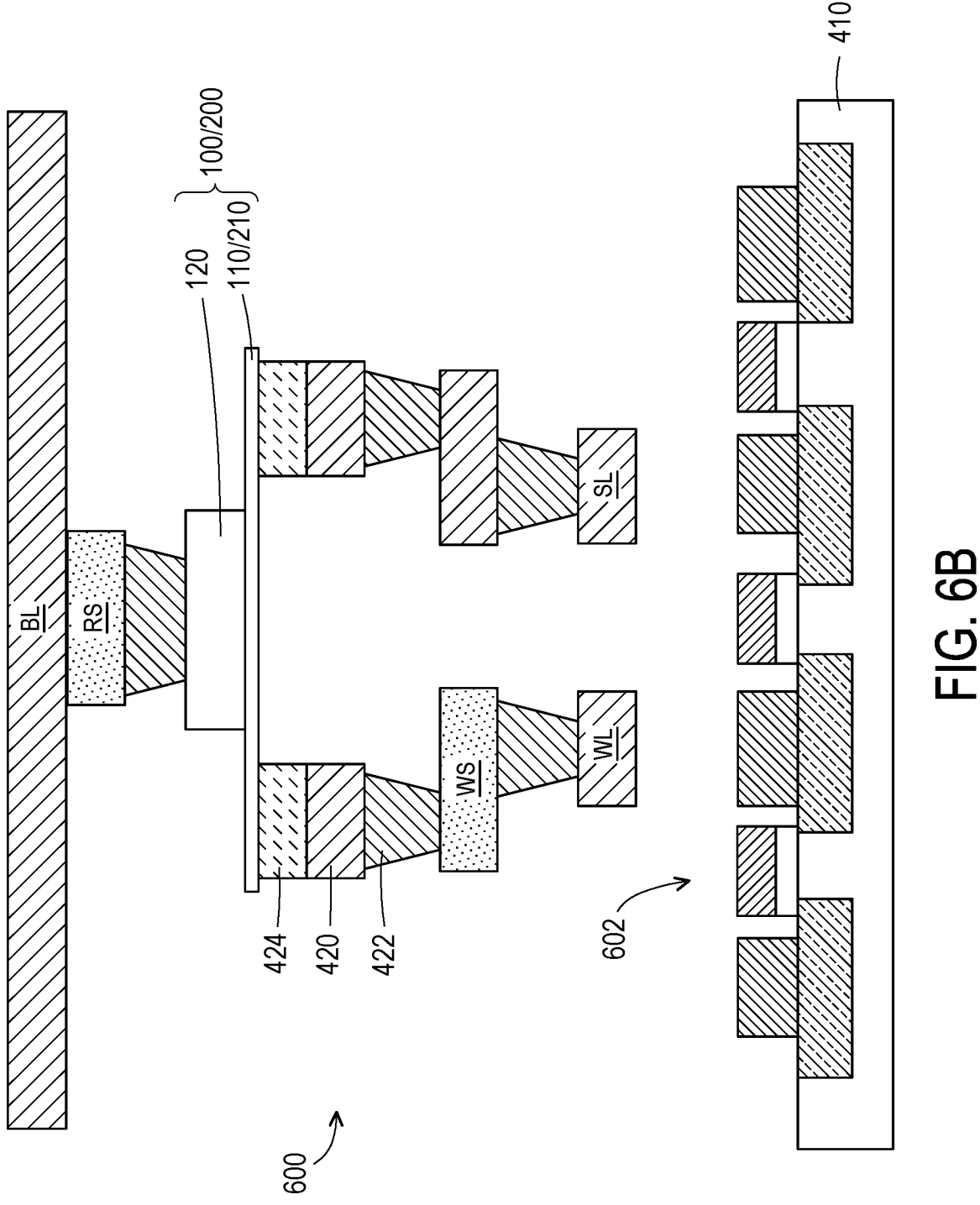
FIG. 6B is a schematic cross-sectional view illustrating one of the memory cells shown in FIG. 6A.

FIG. 6B is a schematic cross-sectional view illustrating one of the memory cells 600 shown in FIG. 6A.

As a difference from the memory cells 400, 500 described with reference to FIG. 4D and FIG. 5B, each memory cell 600 is entirely formed in the metallization layers over the front surface of the semiconductor substrate 410. As shown in FIG. 6B, transistors 602 may be formed at the front surface of the semiconductor substrate 410, whereas the memory cell 600 is elevated from the front surface of the semiconductor substrate 410. The transistors 602 may be interconnected (by interconnections not depicted in FIG. 6B) to form circuits provided to form the drivers coupled to the word lines WL, the bit lines BL and the source lines SL. Alternatively, the transistors 602 may be interconnected to form other circuits, the present disclosure is not limited to functionality of the transistors 602.

The memory cell 600 entirely embedded in the metallization layers includes the magnetoresistive memory device 100/200 as well as the write selector WS and the read selector RS. The write selector WS and the read selector RS may respectively be defined by a pair of electrodes and a switching layer (both not shown) sandwiched in between the electrodes. As examples, the switching layer may be formed of a material including $SiO_x$, $TiO_x$, $AlO_x$, $WO_x$, $Ti_xN_yO_z$, $HfO_x$, $TaO_x$, $NbO_x$, or the like, or suitable combinations thereof, where x, y and z are non-stoichiometric values.

According to some embodiments, the write selector WS is disposed below the SOT channel 110/210 of the magnetoresistive memory device 100/200, whereas the read selector RS is disposed over the MTJ 120 of the magnetoresistive memory device 100/200. In these embodiments, a bottom electrode of the write selector WS may be connected to an underlying conductive pattern 420 functioned as the word line WL, while a top electrode of the write selector WS may be connected to one of the bottom electrode vias 424 in contact with the SOT channel 110/210 from below. In addition, a bottom electrode of the read selector RS may be connected to a top terminal of the MTJ 120, whereas a top electrode of the read selector RS may be connected to an overlying conductive pattern 420 functioned as the bit line BL. Some of the conductive patterns 420 and the conductive vias 422 may be arranged for establishing conduction paths from the write transistor WS to the word line WL and the one of the bottom electrode vias 424. Similarly, some of the conductive patterns 420 and the conductive vias 422 may be arranged for establishing conduction paths from the read selector RS to the MTJ 120 and the bit line BL.

Further, the other bottom electrode via 424 may be connected to an underlying conductive pattern 420 functioned as the source line SL, and some of the conductive patterns 420 and the conductive vias 422 may be arranged for establishing conduction paths from this bottom electrode via 424 to the source line SL.

As described, access of the magnetoresistive memory device 100/200 in each memory cell can be controlled by two transistors respectively having three terminals and formed at a front surface of a semiconductor substrate (also referred to as front end transistors), or by two dual terminal selectors elevated from the front surface of the semiconductor substrate (also referred to as back end selectors). In alternative embodiments, access of the magnetoresistive memory device 100/200 in each memory cell can be controlled by a front end transistor and a back end selector, and circuit design as well as structure of the memory integrated circuit may be modified accordingly.

As above, a magnetoresistive memory device including a composite SOT channel and a MTJ standing on the composite SOT channel is provided. The composite SOT channel is configured to convert an in-plane charge current to spin currents by utilizing spin Hall effect and a combination of orbital Hall effect and orbit-to-spin conversion. As compared to a single spin hall electrode that can only generate spin current by spin Hall effect, the composite SOT channel according to embodiments of the present disclosure can create much more spin current, and therefore exert much greater torque on the MTJ. As a result, the MTJ can be programmed with significantly improved efficiency.

In an aspect of the present disclosure, a magnetoresistive memory device is provided. The magnetoresistive memory device comprises: a magnetic tunneling junction (MTJ), comprising a free layer, a reference layer and a barrier layer lying between the free layer and the reference layer; and a composite spin orbit torque (SOT) channel, in contact with a terminal of the MTJ, and comprising: a first channel layer, configured to convert a portion of a charge current into an orbital current based on orbital Hall effect; and a second channel layer, covering the first channel layer, and configured to convert a portion of the charge current into a first spin current based on spin Hall effect, and to convert the orbital current to a second spin current.

In another aspect of the present disclosure, a magnetoresistive memory device is provided. The magnetoresistive memory device comprises: a magnetic tunneling junction (MTJ), comprising a free layer, a reference layer over the free layer and a barrier layer lying between the free layer and the reference layer; and a composite spin orbit torque (SOT) channel, in contact with a terminal of the MTJ from below the MTJ, and comprising alternately stacked first channel layers and second channel layers, wherein each first channel layer is covered by one of the second channel layers, each first channel layer is configured to convert a portion of a charge current into an orbital current based on orbital Hall effect, and each second channel layer is configured to convert a portion of the charge current into a first spin current based on spin Hall effect, and to convert the orbital current generated by an underlying one of the first channel layers to a second spin current.

In yet another aspect of the present disclosure, memory cells, arranged along rows and columns, and each comprising: a magnetic tunneling junction (MTJ); a composite spin orbit torque (SOT) channel, in contact with a first terminal of the MTJ, and comprising a first channel layer and a second channel layer stacked on the first channel layer, wherein the first channel layer is configured to convert a portion of a charge current into a first orbital current based on orbital Hall effect, and the second channel layer is configured to convert a portion of the charge current into a first spin current based on spin Hall effect, and to convert the first orbital current to a second spin current; a first access selector, coupled to a first edge region of the SOT channel; and a second access selector, coupled to a second edge region of the SOT channel or a second terminal of the MTJ.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetoresistive memory device, comprising:
   a magnetic tunneling junction (MTJ), comprising a free layer, a reference layer and a barrier layer lying between the free layer and the reference layer; and
   a composite spin orbit torque (SOT) channel, in contact with a terminal of the MTJ, and comprising:
   a first channel layer, configured to convert a portion of a charge current into an orbital current based on orbital Hall effect; and
   a second channel layer, covering the first channel layer, and configured to convert a portion of the charge current into a first spin current based on spin Hall effect, and to convert the orbital current to a second spin current.

2. The magnetoresistive memory device according to claim 1, wherein the first and second spin currents are identical in terms of direction.

3. The magnetoresistive memory device according to claim 1, wherein the second channel layer lies in between the first channel layer and the MTJ.

4. The magnetoresistive memory device according to claim 1, wherein the first channel layer is formed of chromium, and the second channel layer is formed of tungsten.

5. The magnetoresistive memory device according to claim 1, wherein the first channel layer is formed by one of chromium, vanadium, manganese and titanium, and the second channel layer is formed by one of tungsten, nickel, platinum, tantalum and gold.

6. The magnetoresistive memory device according to claim 1, wherein an electrical resistivity of the first channel layer ranges from 100 $\mu\Omega\cdot$cm to 1400 $\mu\Omega\cdot$cm.

7. The magnetoresistive memory device according to claim 1, wherein a thickness of the first channel layer ranges from 0.2 nm to 10 nm.

8. The magnetoresistive memory device according to claim 1, wherein a thickness of the second channel layer ranges from 0.5 nm to 5 nm.

9. The magnetoresistive memory device according to claim 1, wherein a total thickness of the composite SOT channel ranges from 0.7 nm to 15 nm.

10. A magnetoresistive memory device, comprising:
    a magnetic tunneling junction (MTJ), comprising a free layer, a reference layer over the free layer and a barrier layer lying between the free layer and the reference layer; and a composite spin orbit torque (SOT) channel, in contact with a terminal of the MTJ from below the MTJ, and comprising alternately stacked first channel layers and second channel layers, wherein each first channel layer is covered by one of the second channel layers, each first channel layer is configured to convert a portion of a charge current into an orbital current based on orbital Hall effect, and each second channel layer is configured to convert a portion of the charge current into a first spin current based on spin Hall effect, and to convert the orbital current generated by an underlying one of the first channel layers to a second spin current.

11. The magnetoresistive memory device according to claim 10, wherein the composite SOT channel comprises two to eight film pairs, each comprising one of the first channel layers and one of the second channel layers.

12. The magnetoresistive memory device according to claim 10, wherein a total thickness of the composite SOT channel ranges from 0.7 nm to 20 nm.

13. The magnetoresistive memory device according to claim 10, wherein the first channel layers are identical with one another in terms of material, and the second channel layers are identical with one another in terms of material.

14. The magnetoresistive memory device according to claim 10, wherein a material for forming at least one of the first channel layers is different from a material for forming others of the first channel layers.

15. The magnetoresistive memory device according to claim 10, wherein a material for forming at least one of the second channel layers is different from a material for forming others of the second channel layers.

16. An integrated memory circuit, comprising:
memory cells, arranged along rows and columns, and each comprising:
a magnetic tunneling junction (MTJ);
a composite spin orbit torque (SOT) channel, in contact with a first terminal of the MTJ, and comprising a first channel layer and a second channel layer stacked on the first channel layer, wherein the first channel layer is configured to convert a portion of a charge current into a first orbital current based on orbital Hall effect, and the second channel layer is configured to convert a portion of the charge current into a first spin current based on spin Hall effect, and to convert the first orbital current to a second spin current;
a first access selector, coupled to a first edge region of the SOT channel; and
a second access selector, coupled to a second edge region of the SOT channel or a second terminal of the MTJ.

17. The integrated memory circuit according to claim 16, wherein the composite SOT channel in each memory cell further comprises:
a third channel layer, configured to convert a portion of the charge current into a second orbital current based on orbital Hall effect; and
a fourth channel layer, configured to convert a portion of the charge current into a third spin current, and to convert the second orbital current to a fourth spin current.

18. The integrated memory circuit according to claim 16, wherein the first and second access selectors are respectively a three-terminal transistor, and the second access selector is coupled to the second edge region of the SOT channel.

19. The integrated memory circuit according to claim 16, wherein the first and second access selectors are respectively a three-terminal transistor, and the second access selector is coupled to the second terminal of the MTJ.

20. The integrated memory circuit according to claim 16, wherein the first and second access selectors are respectively a dual-terminal selector, and the second access selector is coupled to the second terminal of the MTJ 120.

* * * * *